(12) United States Patent
Bacigalupo

(10) Patent No.: US 10,756,721 B2
(45) Date of Patent: Aug. 25, 2020

(54) SHORT CIRCUIT PROTECTION FOR A GATE DRIVER USING PULSED OPERATION

(71) Applicant: Infineon Technologies AG, Neubiberg (DE)

(72) Inventor: Tommaso Bacigalupo, Fuerstenfeldbruck (DE)

(73) Assignee: Infineon Technologies AG, Neubiberg (DE)

( * ) Notice: Subject to any disclaimer, the term of this patent is extended or adjusted under 35 U.S.C. 154(b) by 374 days.

(21) Appl. No.: 15/898,015

(22) Filed: Feb. 15, 2018

(65) Prior Publication Data

US 2019/0253045 A1   Aug. 15, 2019

(51) Int. Cl.
  *H03K 17/082*   (2006.01)

(52) U.S. Cl.
  CPC . *H03K 17/0828* (2013.01); *H03K 2217/0027* (2013.01)

(58) Field of Classification Search
  CPC ....... H03K 17/0828; H03K 2217/0027; H03K 17/08128; H03K 17/687; H03K 17/567; H03K 17/08122
  USPC ...................................................... 361/93.1
  See application file for complete search history.

(56) References Cited

U.S. PATENT DOCUMENTS

| | | | |
|---|---|---|---|
| 10,254,327 B2 * | 4/2019 | Mauder | G01R 31/50 |
| 10,381,823 B2 * | 8/2019 | Djelassi | H02H 3/04 |
| 2004/0070995 A1 * | 4/2004 | Sugimoto | H02M 3/33507 363/20 |
| 2017/0207780 A1 * | 7/2017 | Chen | H03K 17/163 |
| 2019/0068045 A1 * | 2/2019 | Ramabhadran | H02M 1/08 |
| 2019/0158083 A1 * | 5/2019 | Horiguchi | H03K 17/165 |

OTHER PUBLICATIONS

"High Voltage IGBT Driver for Automotive Applications," EiceDriver SIL, 1EDI2001AS, Single Channel Isolated Driver for Inverter Systems AC Step, Infineon Technologies AG, Jun. 30, 2015; 135 pages.
"High Current IGBT Gate Driver," NCD5700, www.onsemi.com, Rev. 4, Jun. 2017, 18 pages.

* cited by examiner

*Primary Examiner* — Dharti H Patel
(74) *Attorney, Agent, or Firm* — Slater Matsil, LLP

(57) ABSTRACT

A method of protecting a gate driver circuit includes receiving an input signal to energize a gate driver output of the gate driver circuit, determining that an abnormal operating condition exists at the gate driver output, continuously energizing the gate driver output for a time period, and entering a pulsed mode of operation for energizing the gate driver output after the time period has lapsed.

20 Claims, 4 Drawing Sheets

SHORT CIRCUIT PROTECTION FOR A GATE DRIVER USING PULSED OPERATION

TECHNICAL FIELD

The present invention relates generally to a system and method for short circuit protection for a gate driver using pulsed operation.

BACKGROUND

A gate driver is typically a power amplifier and may also include additional circuitry that accepts a low-power input signal from an associated controller IC and produces a high-current drive input signal for the gate of a high-power transistor such as an IGBT or a power MOSFET. Sometimes the IGBT or power MOSFET transistor can experience an overcurrent or overvoltage situation that can lead to transistor overheating and eventually transistor damage if the situation is not addressed. During these overcurrent or overvoltage operational conditions the gate driver itself can also be damaged.

SUMMARY

According to an embodiment, a method of protecting a gate driver circuit comprises receiving an input signal to energize a gate driver output of the gate driver circuit; determining that an abnormal operating condition exists at the gate driver output; continuously energizing the gate driver output for a defined time period; and entering a pulsed mode of operation for energizing the gate driver output after the defined time period has lapsed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
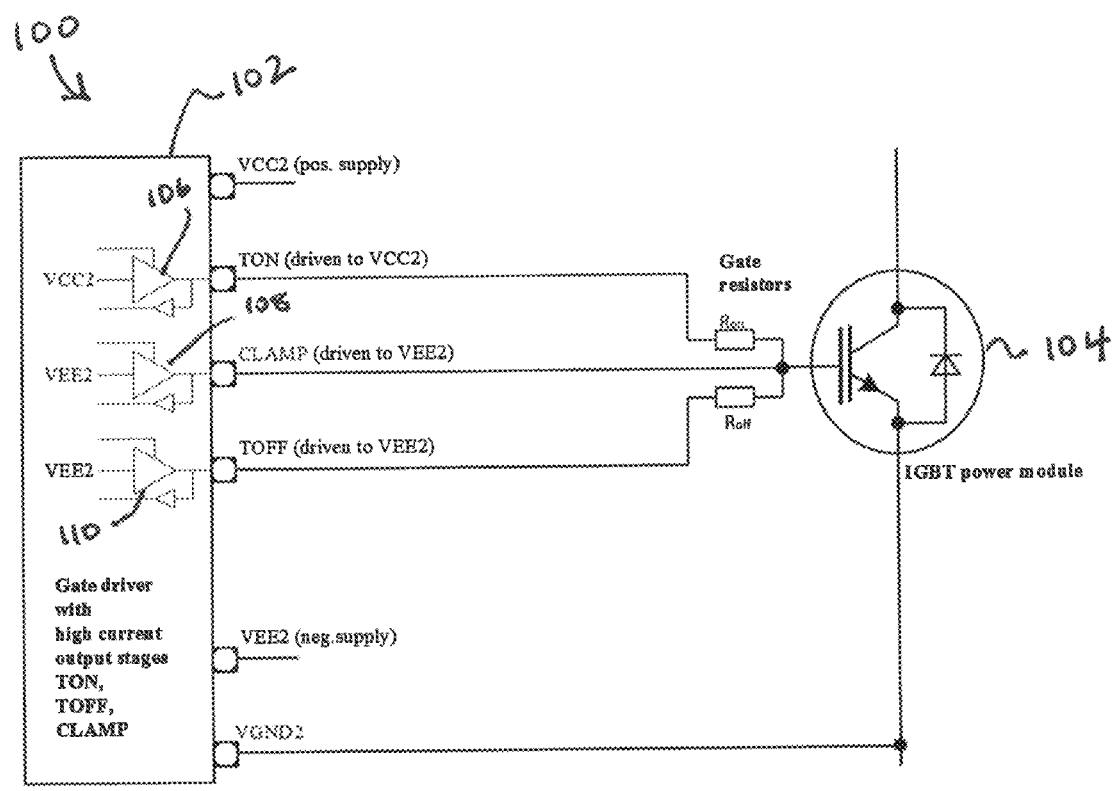
FIG. 1 is a diagram of a power system including an IGBT power module and a gate driver circuit, according to an embodiment.

FIG. 1 illustrates a power system 100 including an integrated circuit gate driver 102 and a driven power switch, which is shown as an IGBT power module 104 in an embodiment. The gate driver 102 includes three high current output stages, although only one such output stage is needed and any number can be used as might be required for a specific application. Output stage 106, which is driven to a positive power supply voltage VCC2 at a TON pin, includes an amplifier portion and a monitoring portion that will be explained in further detail below. Output stage 108, which is driven to a negative power supply voltage VEE2 at a CLAMP pin, also includes an amplifier portion and a monitoring portion that will be explained in further detail below. Output stage no, which is also driven to the negative power supply voltage VEE2 at a TOFF pin, also includes an amplifier portion and a monitoring portion that will be explained in further detail below. Gate driver 102 also includes the positive power supply pin VCC2, the negative power supply pin VEE2, and a ground pin VGND2. Gate driver 102 can also be integrated together with other control functions (not shown) for the power system 100 such as digital and analog input and output control pins, and corresponding digital and analog control circuitry.

IGBT power module 104 includes an IGBT transistor and an anti-parallel diode, in an embodiment. Other types of power transistors such as MOSFET and SiC (Silicon Carbide) transistors can also be used. Power module 104 can be integrated or comprised of discrete components. The TON pin of gate driver 102 is coupled to the gate of IGBT power module 104 through an $R_{ON}$ resistor, the CLAMP pin of gate driver 102 is directly coupled to the gate of IGBT power module 104, and the TOFF pin of gate driver 102 is coupled to the gate of IGBT power module 104 through an $R_{OFF}$ resistor.

The next generation of integrated gate drivers for FET/IGBT/SiC power modules such as IGBT power module 104 may have multiple high current outputs for controlling the ON/OFF state of the power module. These power modules 104 will impose a high capacitive load on the gate driver 102 outputs. The gate driver 102 outputs can usually source or sink currents up to 10 Amperes. In normal operation, the charging and discharging of these capacitive loads takes only several loons, causing the peak current to last only for this short period. In abnormal conditions (e.g. a short circuit on a printed circuit board (PCB) due to an external metal bridge, e.g. a screwdriver falling down) the maximum current could flow for the complete duration of the short circuit, leading to destruction of the gate driver. In safety critical applications (e.g. an automotive motor inverter) it is dangerous to give up the control of the power module 104, i.e. a self-destruction of the gate driver 102 has to be avoided and nevertheless the targeted ON/OFF state should be reached.

The subsequent description is therefore primarily directed to the protection of the gate driver 102 itself, and not primarily directed to the protection of the power module 104 against over current. Protection of the power module 104 is usually accomplished with desaturation (DESAT) and/or overcurrent protection (OCP) signals and attendant circuitry and is not further explained here.

The maximum current of the output stages is defined for all gate drivers in gate driver 102. Usually, external resistors are used to adjust the slew rates for ON/OFF switching of the power module 104. These external resistors would also limit the current, if the short circuit does occurs beyond the resistor location in the power system 100. In an embodiment, the gate driver 102 monitors the current of its own output stage as is explained in further detail below and is thus effective for addressing any short circuit condition arising anywhere beyond the corresponding gate driver output pin.

Thermal shut down can sometimes be used for an over temperature condition of the gate driver 102, but the temperature rise rate is typically too slow for preventing a self-destruction in the case of a short circuit at an output.

Detecting short circuit conditions at the outputs of gate driver 102 and triggering a release to a tri-state operating condition can prevent self-destruction of the gate driver 102, but releases the control of the power module 104 permanently.

According to embodiments, the gate driver 102 monitors its outputs for short circuit (high current) events. The gate driver measures the length of these short circuit events. If the short circuit event exceeds a defined time, the gate driver is switched to a pulsed operation mode. For example, the pulsed operation mode can be achieved by toggling between a tri-state mode of operation and an active driving mode of operation having a relaxed duty cycle. The pulsed operation mode is continued as long as short circuit event continues.

It is important to note that the defined time period is carefully chosen to prevent damage to the output stages of driver circuit 102. In other words, since initial heating up of the output stage 106, 108, or no of driver circuit 102 occurs during the defined time period, the timing has to be chosen in such a way, that the output stage is ideally tri-stated before the maximum current leads to a corresponding destructive temperature. The duty cycle of the pulsed operation is also carefully chosen. The pulsed operation runs with a safe duty cycle that is chosen to prevent further overheating. In other words, a relatively low duty cycle will prevent further overheating, but a relatively high duty cycle may not prevent further heating. The defined time period and the safe duty cycle can vary and are chosen based on simulations of a specific application.

It is an advantage of embodiments of the gate driver circuit that the gate driver 102 protects itself against destruction, even in the short circuit case. The gate driver 102 automatically attempts to regain the control of the output signal and no action from a microprocessor associated with the gate driver circuit 102 is required. Once the short circuit event is removed, the gate driver 102 can continue with its normal operation.

Figure 2:
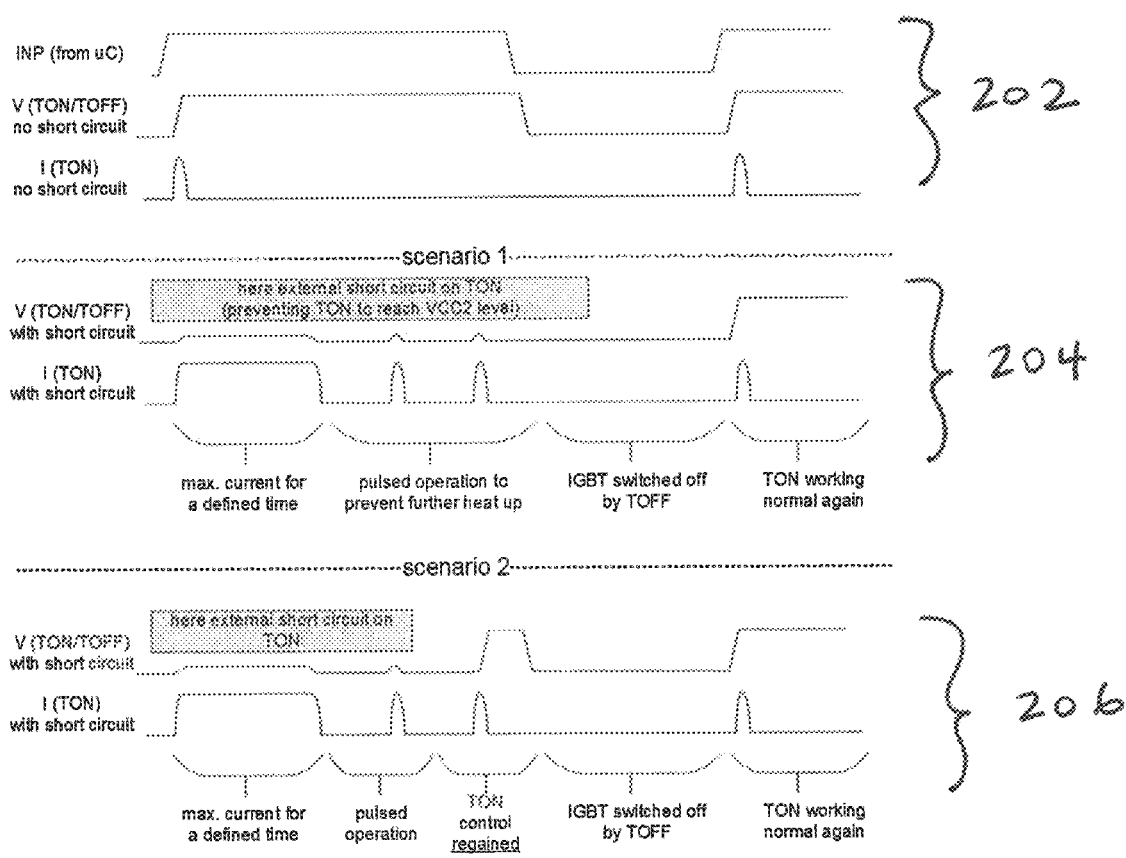
FIG. 2 is a timing diagram associated with the gate driver circuit of FIG. 1.

Turning now to FIG. 2 three modes of operation are illustrated in timing diagram portions 202, 204, and 206.

Timing diagram portion 202 illustrates a normal operating condition in which no short circuit condition is present. An INP input signal is received from a microprocessor resident on the gate driver circuit 102 (best seen in FIG. 3 and will be described in further detail below.) The INP input signal shows a normal input signal toggling between a digital logic high and low state. The corresponding voltage output V (TON/TOFF) at the TON pin is also shown, which mirrors the INP signal. The corresponding current output I (TON) is also shown, which include a current pulse at the positive-going edges of the output voltage signal. The current pulse is due to the capacitive nature of the gate input of the IGBT power switch 104.

Timing diagram portion 204 illustrates a short circuit event during one complete turn ON phase. During the defined time the output voltage is limited to a small value associated with the short circuit condition, but the output current is at the full maximum value for the entirety of the defined time. During the pulsed mode of operation, two small voltage pulses are shown, and two maximum current pulses are shown. In a subsequent time period the IGBT 104 is switched off by the action, for example, of the TOFF pin. In the example shown, the short circuit condition is subsequently removed and once the TON pin attempts to turn on IGBT 104 a normal voltage step and corresponding maximum current pulse are shown.

Timing diagram portion 206 illustrates an intermittent short circuit during a turn ON phase. During the defined time the output voltage is limited to a small value associated with the short circuit condition, but the output current is at the full maximum value for the entirety of the defined time. During the pulsed mode of operation, only one small voltage pulse is shown, and two maximum current pulses are shown. The short circuit condition is maintained for the first voltage pulse. After the first voltage pulse, the short circuit condition is removed and control is automatically regained over IGBT 104. Thus, a second normal voltage pulse is shown with an associated maximum current pulse. In a subsequent time period the IGBT 104 is switched off by the action, for example, of the TOFF pin. In the example shown, the short circuit condition had already been removed and once the TON pin attempts to turn on IGBT 104 a normal voltage step and corresponding maximum current pulse are shown.

In embodiments, the protection scheme for gate driver circuit 102 can be applied to any high current output of the gate driver (TON/TOFF/CLAMP). For low active outputs the waveforms can be inverted.

Figure 3:
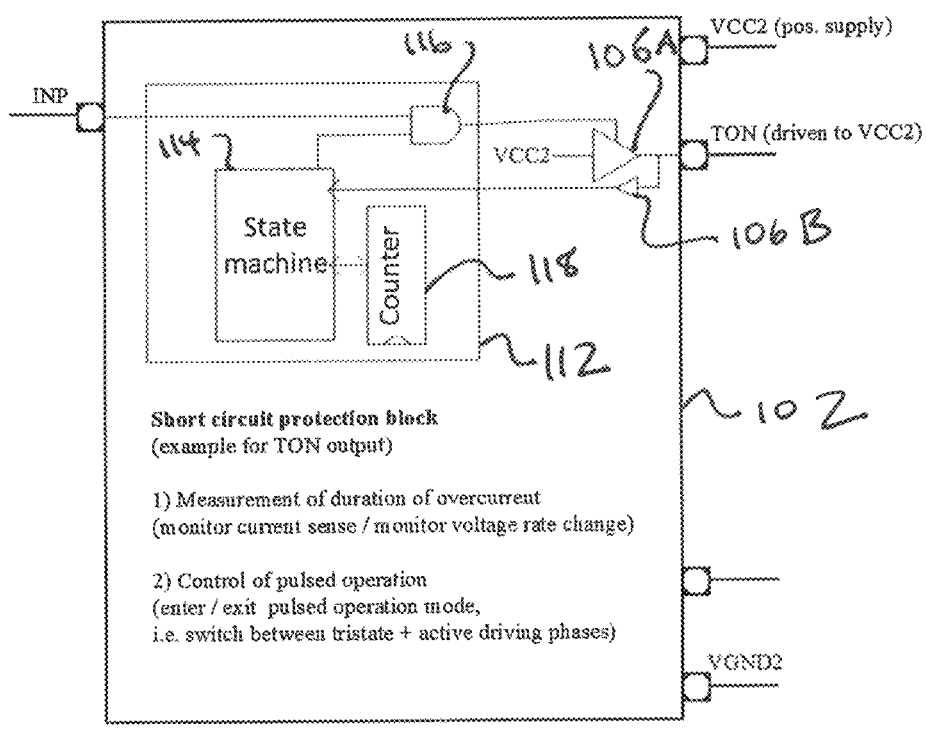
FIG. 3 is a more detailed diagram of the gate driver circuit of FIG. 1.

Referring to FIG. 3, further details of an embodiment for implementing the gate driver protection circuit and method are shown. Output stage 106 is shown having an output driver portion 106A coupled to the TON pin and a sensing portion 1006B having an input coupled to the TON pin. In the example of FIG. 3, gate driver circuit 102 includes a digital circuit such as a microprocessor or other digital circuitry 112 including a state machine 114 coupled to a counter 118. The state machine 114 includes the present information of whether the driver circuit 102 is in the pulsed mode of operation or not. An AND gate 116 receives the INP input signal, which can be generated by another microprocessor either on or off gate driver circuit 102, and the output of the state machine 114. The output of AND gate 116 controls the output stage 106A. The sensing portion 106B has an input coupled to the output of output stage 106A and an output coupled to an input of state machine 114.

Sensing portion 106B can be implemented by sensing the output current of output stage 106A with a shunt resistor (or similar known current sensing circuits or methods), monitoring the slew rate of the voltage change of the output, or monitoring the output voltage to reach defined levels in a defined time. While output pin TON is shown, the other pins CLAMP and TOFF can also be used. Embodiments may use only one such pin, or all three pins.

The duration of the short circuit occurrence can be measured by a digital counter 118 or can be implemented as an analog circuit comparing the measured time against an analog delay time. The counter 118 is used to switch to the pulsed operation mode (interleaved tristate+active driving), if the measured duration is above a given threshold (representing the worst case driver heat up) and stays in the pulsed operation mode as long as the output is ON and short circuit is still detected (preventing thermal self-destruction as previously described). The entirety of the digital logic circuit 112 can be replaced partly by equivalent analog logic (e.g. RC delays can be used instead of counters, in an embodiment).

Figure 4:
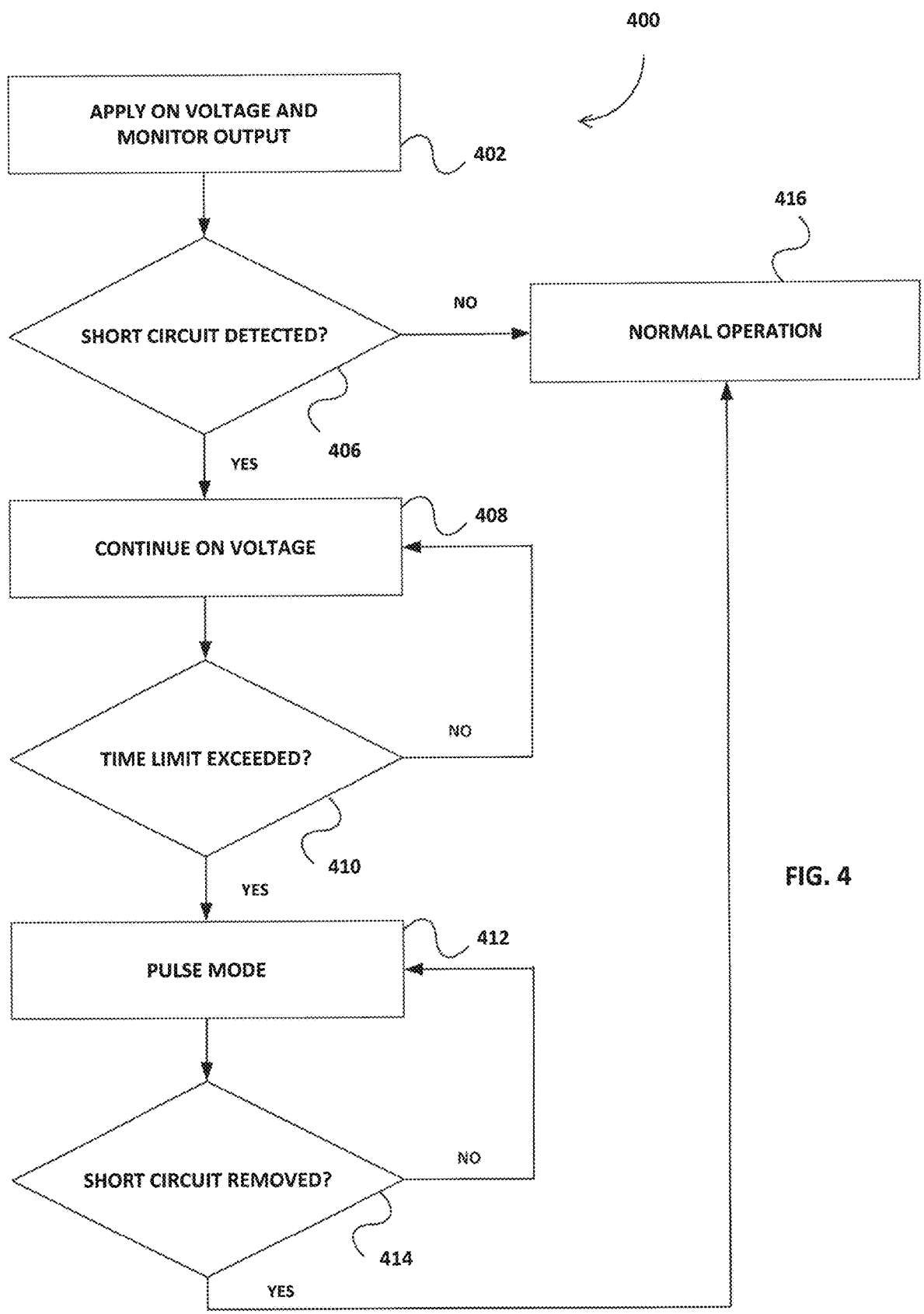
FIG. 4 is a flow chart of a method of operating a gate driver according to an embodiment.

A flow chart for a method of switching a gate driver to a pulsed mode of operation for the duration of the overcurrent condition according to embodiments is shown in FIG. 4. Flow chart 400 begins with step 402 in which an "ON voltage" is applied to the output pin of a gate driver circuit that is coupled to a power switch such as an IGBT module, and the output pin is monitored or sensed as previously described. Decision block 406 determines whether or not a short circuit condition is present? If not, normal operation proceeds at step 416. If there is a short circuit condition, then the "ON voltage" is continued at step 408. Decision block 410 determines whether or not the continued "ON voltage" exceeds a predetermined time limit. If not, the "ON voltage" is continued. If the predetermined time limit is exceeded, then the pulse mode of operation is entered at step 412.

Decision block 414 determines whether or not the short circuit condition has been removed. If not, then the pulse mode of operation is continued. If the short circuit condition has been removed, then normal operation is automatically entered at step 416 due to the embodiment circuitry shown in FIG. 3.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of protecting a gate driver circuit comprising:
    receiving an input signal to energize a gate driver output of the gate driver circuit;
    determining that an abnormal operating condition exists at the gate driver output;
    continuously energizing the gate driver output for a defined time period; and
    entering a pulsed mode of operation for energizing the gate driver output after the defined time period has lapsed.

2. The method of claim 1, wherein energizing the gate driver output comprises driving the gate driver output with a voltage step at a pin of the gate driver circuit.

3. The method of claim 1, wherein determining that an abnormal operating condition exists at the gate driver output comprises measuring an operating characteristic at the gate driver output and determining that the measured operating characteristic is different from an expected normal voltage.

4. The method of claim 1, further comprising tri-stating the gate driver output in response to a change in the input signal.

5. The method of claim 1, further comprising terminating the pulsed mode of operation once the abnormal operating condition is detected as being removed.

6. The method of claim 5, further comprising continuously energizing the gate driver output in response to continuously receiving the input signal to energize a gate driver output.

7. The method of claim 5, further comprising tri-stating the gate driver output in response to a change in the input signal.

8. The method of claim 1, further comprising coupling the gate driver output to a switch.

9. A gate driver circuit comprising:
    an input pin configured to receive an input signal;
    a gate driver coupled to a gate driver output pin;
    a logic circuit coupled between the input pin and the gate driver; and
    a sense circuit coupled between the gate driver output pin and the logic circuit,
    wherein the gate driver circuit is configured to detect at abnormal operating condition at the gate driver output pin, to provide a continuous mode of operation for a defined time period, and to provide a pulsed mode of operation after the defined time period has lapsed.

10. The gate driver circuit of claim 9, wherein the gate driver output pin comprises at least one of a turn-on pin, a clamp pin, or a turn-off pin.

11. The gate driver circuit of claim 9, wherein the logic circuit comprises a state machine coupled to a counter.

12. The gate driver circuit of claim 9, wherein the sense circuit comprises a buffer amplifier.

13. The gate driver circuit of claim 9, wherein the sense circuit is configured to sense an operating characteristic at the gate driver output pin.

14. The gate driver circuit of claim 9, wherein the gate driver circuit is configured to provide a positive voltage continuous mode of operation for a defined time period, and a positive voltage pulsed mode of operation after the defined time period has lapsed.

15. The gate driver circuit of claim 9, wherein the gate driver circuit is configured to provide a negative or zero voltage continuous mode of operation for a defined time period, and a negative or zero voltage pulsed mode of operation after the defined time period has lapsed.

16. The gate driver circuit of claim 9, wherein the gate driver circuit is configured to provide a tri-state mode of operation in response to a change in the input signal.

17. A gate driver circuit comprising:
    an input pin configured to receive an input signal;
    a first gate driver coupled between the input pin and a first gate driver output pin;
    wherein the gate driver circuit is configured to detect an abnormal condition at the respective gate driver output pin, to provide a continuous mode of operation for a defined time period, and to provide a pulsed mode of operation after the defined time period has lapsed.

18. The switch system of claim 17, wherein the first gate driver output pin comprises a turn-on pin configured for driving a positive voltage.

19. The switch system of claim 17, further comprising a second gate driver coupled between the input pin and a second gate driver output pin, and wherein the second gate driver output pin comprises a clamp pin configured for driving a negative voltage.

20. The switch system of claim 17, further comprising a third gate driver coupled between the input pin and a third gate driver output pin, and wherein the third gate driver output pin comprises a turn-off pin configured for driving a negative voltage.

* * * * *